United States Patent
Kashiyama (10) Patent No.: US 9,685,363 B2
(45) Date of Patent: Jun. 20, 2017

(54) ALIGNMENT DEVICE AND SUBSTRATE PROCESSING APPARATUS

(71) Applicant: Masahito Kashiyama, Kyoto (JP)

(72) Inventor: Masahito Kashiyama, Kyoto (JP)

(73) Assignee: SCREEN Semiconductor Solutions Co., Ltd. (JP)

(*) Notice: Subject to any disclaimer, the term of this patent is extended or adjusted under 35 U.S.C. 154(b) by 263 days.

(21) Appl. No.: 14/132,334

(22) Filed: Dec. 18, 2013

(65) Prior Publication Data

US 2014/0196663 A1 Jul. 17, 2014

(30) Foreign Application Priority Data

Jan. 16, 2013 (JP) ................................ 2013-005506

(51) Int. Cl.
*B05C 13/00* (2006.01)
*H01L 21/68* (2006.01)

(52) U.S. Cl.
CPC .................................. *H01L 21/681* (2013.01)

(58) Field of Classification Search
None
See application file for complete search history.

(56) References Cited

U.S. PATENT DOCUMENTS

| | | | |
|---|---|---|---|
| 3,695,911 A | * | 10/1972 | Polin ...................... B05D 1/005 264/311 |
| 5,194,743 A | * | 3/1993 | Aoyama ............... H01L 21/681 250/548 |
| 6,052,913 A | * | 4/2000 | Kaneko .................. H01L 21/68 33/533 |
| 6,368,049 B1 | | 4/2002 | Osaka et al. .................. 414/783 |
| 2002/0070095 A1 | | 6/2002 | Osaka et al. .................. 198/394 |
| 2009/0030547 A1 | | 1/2009 | Rice et al. ..................... 700/218 |

(Continued)

FOREIGN PATENT DOCUMENTS

| JP | 11-040652 A | 2/1999 |
|---|---|---|
| JP | 2000-077501 | 3/2000 |

(Continued)

OTHER PUBLICATIONS

Office Action dated Aug. 16, 2016 in counterpart Taiwanese Patent Application No. 102147650.

(Continued)

*Primary Examiner* — Charles Capozzi
(74) *Attorney, Agent, or Firm* — Ostrolenk Faber LLP (57) ABSTRACT

An aligner includes a plurality of substrate rotators and a shaft member. Each substrate rotator includes a holder, a notch detector, an electromagnetic clutch and a driving belt. Each holder sucks the back surface of the substrate under vacuum and horizontally holds the substrate. Each notch detector detects a notch formed at the substrate, and supplies a detection result to the corresponding electromagnetic clutch as a detection signal. One end of the shaft member is connected to a motor. The shaft member is continuously rotated by the motor. Each electromagnetic clutch switches to a connection state in which rotational force of an inner periphery is transmitted to an outer periphery and a disconnection state in which rotational force of the inner periphery is transmitted to the outer periphery according to a detection signal supplied from the notch detector.

7 Claims, 8 Drawing Sheets

(56) References Cited

U.S. PATENT DOCUMENTS

2009/0053021 A1    2/2009  Yamagishi et al. ...... 414/222.02
2011/0063588 A1*   3/2011  Kashiyama ........... G03F 7/2028
                                                         355/27

FOREIGN PATENT DOCUMENTS

| JP | 2000-294619   | 10/2000 |
| JP | 2009-027184 A | 2/2009  |
| JP | 4672010 B2    | 4/2011  |
| JP | 2012-023287 A | 2/2012  |

OTHER PUBLICATIONS

Notice of Reasons for Refusal dated Dec. 6, 2016 in the counterpart Japanese Patent Application No. 2013-005506.

* cited by examiner

ALIGNMENT DEVICE AND SUBSTRATE PROCESSING APPARATUS

BACKGROUND OF THE INVENTION

Field of the Invention

The present invention relates to an alignment device and a substrate processing apparatus that includes the alignment device.

Description of Related Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing. Alignment for a substrate is performed before processing for the substrate such that a notch formed at the substrate is aligned in a specific direction with respect to the center of the substrate. In JP 2000-77501 A, a wafer with a notch alignment mechanism that can simultaneously perform alignment for five wafers is described. This wafer with a notch alignment mechanism includes five wafer alignment units. Each wafer alignment unit has a rotation table that is rotatably provided, a motor for driving to rotate the rotation table and a notch detection sensor for detecting a notch of the wafer. In each wafer alignment unit, in a case in which the wafer is placed on the rotation table, the notch of the wafer is detected by the notch detection sensor while the rotation table is rotated by the motor, and the wafer is aligned such that the notch is aligned in a desired direction with respect to the center of the wafer.

BRIEF SUMMARY OF THE INVENTION

In the above-mentioned wafer with a notch alignment mechanism, the plurality of motors are provided in order to rotate the plurality of rotation tables, and a plurality of transmission mechanisms for respectively transmitting the rotation from the plurality of these motors to the plurality of rotation tables are provided. Therefore, the size of the device increases and the configuration of the device becomes complicated.

An object of the present invention is to provide an alignment device that can perform alignment for a plurality of substrates with a simple configuration and a substrate processing apparatus that includes the alignment device.

(1) According to one aspect of the present invention, an alignment device includes a plurality of holders respectively configured to be rotatable about a rotational center axis in a vertical direction while holding a substrate having a portion for detection (a portion to be detected) substantially in a horizontal attitude, and arranged to line up in a vertical direction, a shaft member having an axis that extends in the vertical direction, a rotation driver that rotates the shaft member with the axis as a center, a plurality of detectors provided to respectively correspond to the plurality of holders, and respectively configured to detect the portions for detection of the substrates held by the corresponding holders, a plurality of transmission switchers that are provided to respectively correspond to the plurality of holders, and switch to a transmission state in which rotation of the shaft member is transmitted to the corresponding holder and a non-transmission state in which rotation of the shaft member is not transmitted to the corresponding holder, wherein the plurality of transmission switchers are configured to switch from the transmission state to the non-transmission state based on a detection result by the corresponding detector when a portion for detection of the substrate rotated by the corresponding holder is positioned in a predetermined common direction with respect to the rotational center axis.

In the alignment device, the plurality of holders are arranged to line up in the vertical direction, and the plurality of detectors and the plurality of transmission switchers are respectively provided to correspond to the plurality of holders. Further, the shaft member having an axis that extends in the vertical direction is provided, and the shaft member is rotated by the rotation driver.

In a case in which the substrate is held by each holder, the corresponding transmission switcher switches to the transmission state, whereby rotational force of the shaft member is transmitted to the holder. Thus, the substrate held by the holder is rotated. Further, the portion for detection of the substrate is detected by the corresponding detector with the substrate being rotated by each holder. The corresponding transmission switcher switches to the non-transmission state based on the detection result. Thus, rotation of the substrate can be stopped with the portion for detection of the substrate held by each holder being aligned in a constant direction with respect to the rotational center axis.

In this manner, the rotational force of the common shaft member rotated by the common rotation driver is respectively transmitted to the plurality of holders via the plurality of transmission switchers, and the rotation of the plurality of holders is respectively stopped at desired time points. Thus, it is possible to concurrently perform the alignment for the plurality of substrates with a simple configuration without providing the plurality of rotation drivers.

(2) Each transmission switcher may include a clutch attached to the shaft member and a transmission member that transmits rotational force to the corresponding holder from the clutch, and the transmission switcher may enter the transmission state when the clutch is connected, and the transmission switcher may enter the non-transmission state when the clutch is disconnected.

In this case, each transmission switcher can easily switch to the transmission state and the non-transmission state with a simple configuration.

(3) The plurality of detectors may be arranged to line up on a straight line in the vertical direction parallel to the rotational center axes of the plurality of holders, and may be configured to detect the portions for detection when the portions for detection of the substrates rotated by the corresponding holders are aligned in the predetermined direction with respect to the rotational center axis, and the plurality of transmission switchers may be configured to switch from the transmission state to the non-transmission state when the portions for detection of the substrates are detected by the corresponding respective detectors.

In this case, when the portion for detection of the substrate held by each holder is aligned in a constant direction with respect to the rotational center axis, the portion for detection is detected by the corresponding detector, and the corresponding transmission switcher switches from the transmission state to the non-transmission state. Thus, the portion for detection of the substrate held by each holder is aligned in a constant direction with respect to the rotational center axis. Therefore, alignment for the plurality of substrates can be easily performed.

(4) According to another aspect of the present invention, a substrate processing apparatus includes a processing unit that performs predetermined processing on a substrate, the alignment device according to one aspect of the present invention, and a first transport mechanism configured to transport the substrate after alignment by the alignment device to the processing unit.

In the substrate processing apparatus, the substrate after alignment by the alignment device according to one aspect of the present invention is transported to the processing unit by the first transport mechanism. Thus, the orientations of the substrates transported to the processing unit are unified. Therefore, processing accuracy of the substrates is improved.

Further, because the alignment device according to the one aspect of the present invention is used, alignment for the plurality of substrates can be concurrently performed with a simple configuration. Thus, throughput of the substrate processing apparatus is prevented from being reduced, and complication in configuration of the substrate processing apparatus is suppressed.

(5) The substrate processing apparatus may further include a processing section, a carry-in/carry-out section for carrying in the substrate to and carrying out the substrate from the processing section, an interface section provided between the processing section and the carry-in/carry-out section, wherein the processing section may include the processing unit and the first transport mechanism, the carry-in/carry-out section may include a container platform on which a storing container that stores the substrate is placed, and a second transport mechanism that transports the substrate between the storing container placed on the container platform and the interface section, and the interface section may include the alignment device.

In this case, the substrate stored in the storing container placed on the container platform in the carry-in/carry-out section is transported to the alignment device in the interface section by the second transport mechanism. The substrate after alignment by the alignment device is transported to the processing unit by the first transport mechanism. In this manner, because receiving and transferring for the substrates between the first transport mechanism and the second transport mechanism are performed via the alignment device, throughput of the substrate processing device is prevented from being reduced.

(6) The substrate processing apparatus may further include an appearance inspection device that inspects appearance of the substrate after processing by the processing unit.

In this case, the orientations of the substrates transported to the appearance inspection device are unified. Therefore, when the processing that is performed on the substrate in the processing unit is not symmetrical but eccentric with the center of the substrate, the direction of eccentricity can be accurately specified at the time of the appearance inspection. Therefore, the operation of each constituent element is corrected based on the result of the appearance inspection, whereby processing can be appropriately performed on the substrate.

The present invention enables the alignment for the plurality of substrates to be concurrently performed with a simple configuration.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask and the like.

(1) Overall Configuration

Figure 1:
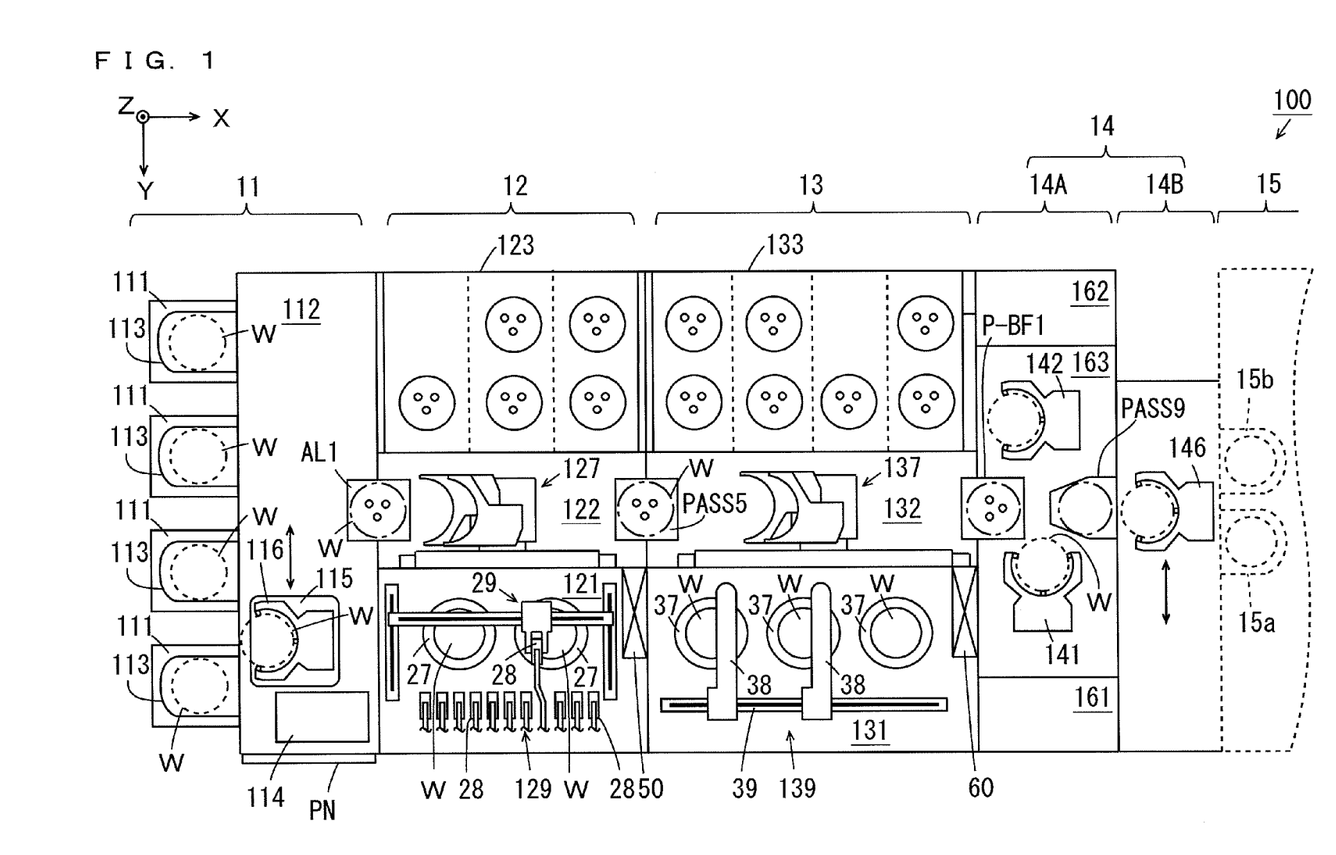
FIG. 1 is a schematic plan view showing the configuration of a substrate processing apparatus.

FIG. 1 is a schematic plan view showing the configuration of the substrate processing apparatus 100. FIG. 1 and subsequent given diagrams are accompanied by the arrows that indicate X, Y, and Z directions orthogonal to one another for clarity of a positional relationship as needed. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning/drying processing block 14A and a carry-in/carry-out block 14B. An interface block 14 is constituted by the cleaning/drying processing block 14A and the carry-in/carry-out block 14B. An exposure device 15 is arranged to be adjacent to the carry-in/carry-out block 14B. In the exposure device 15, exposure processing is performed on the substrate W using a liquid immersion method.

The indexer block 11 includes a plurality of carrier platforms 111 and a transport section 112. In each carrier platform section 111, a carrier 113 for storing a plurality of substrates W in multiple stages is placed.

A controller 114 and a transport mechanism 115 are provided in the transport section 112. The controller 114 controls various constituent elements of the substrate processing apparatus 100. The transport mechanism 115 has a hand 116 for holding the substrate W. The transport mechanism 115 holds the substrate W using the hand 116 and transports the substrate W.

The first processing block 12 includes a coating processing section 121, a transport section 122 and a thermal processing section 123. The coating processing section 121 and the thermal processing section 123 are provided to be opposite to each other with the transport section 122 held therebetween. As described below, an aligner AL1, an aligner AL2 for aligning the substrate W, and substrate platforms PASS1, PASS2 (see FIG. 4) on which the substrates W are placed are provided between the transport section 122 and the transport section 112. The alignment for the substrate W refers to arranging a notch NT (see FIG. 5) formed at the substrate W in a specific direction with respect to the center of the substrate W. Details of the aligners AL1, AL2 will be described below. A transport mechanism 127 and a below-mentioned transport mechanism 128 (see FIG. 4) that transport the substrates W are provided in the transport section 122.

The second processing block 13 includes a development processing section 131, a transport section 132 and a thermal processing section 133. The development processing section 131 and the thermal processing section 133 are provided to be opposite to each other with the transport section 132 held therebetween. A substrate platform PASS5 and below-mentioned substrate platforms PASS6 to PASS8(see FIG. 4) on which the substrates W are placed are provided between the transport section 132 and the transport section 122. A transport mechanism 137 and a below-mentioned transport mechanism 138 (see FIG. 4) that transport the substrates W are provided in the transport section 132.

The cleaning/drying processing block 14A includes cleaning/drying processing sections 161, 162 and a transport section 163. The cleaning/drying processing sections 161, 162 are provided to be opposite to each other with the transport section 163 held therebetween. Transport mechanisms 141, 142 are provided in the transport section 163. A placement/buffer section P-BF1 and a below-mentioned placement/buffer section P-BF2 (see FIG. 4) are provided between the transport section 163 and the transport section 132. The placement/buffer sections P-BF1, P-BF2 are configured to be capable of storing the plurality of substrates W.

Further, a substrate platform PASS9 and a below-mentioned placement/cooling platform P-CP (see FIG. 4) are provided to be adjacent to the carry-in/carry-out block 14B between the transport mechanisms 141, 142. The placement/cooling platform P-CP has a function of cooling the substrate W. In the placement/cooling platform P-CP, the substrate W is cooled to a temperature suitable for the exposure processing.

A transport mechanism 146 is provided in the carry-in/carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided at the exposure device 15.

Figure 2:
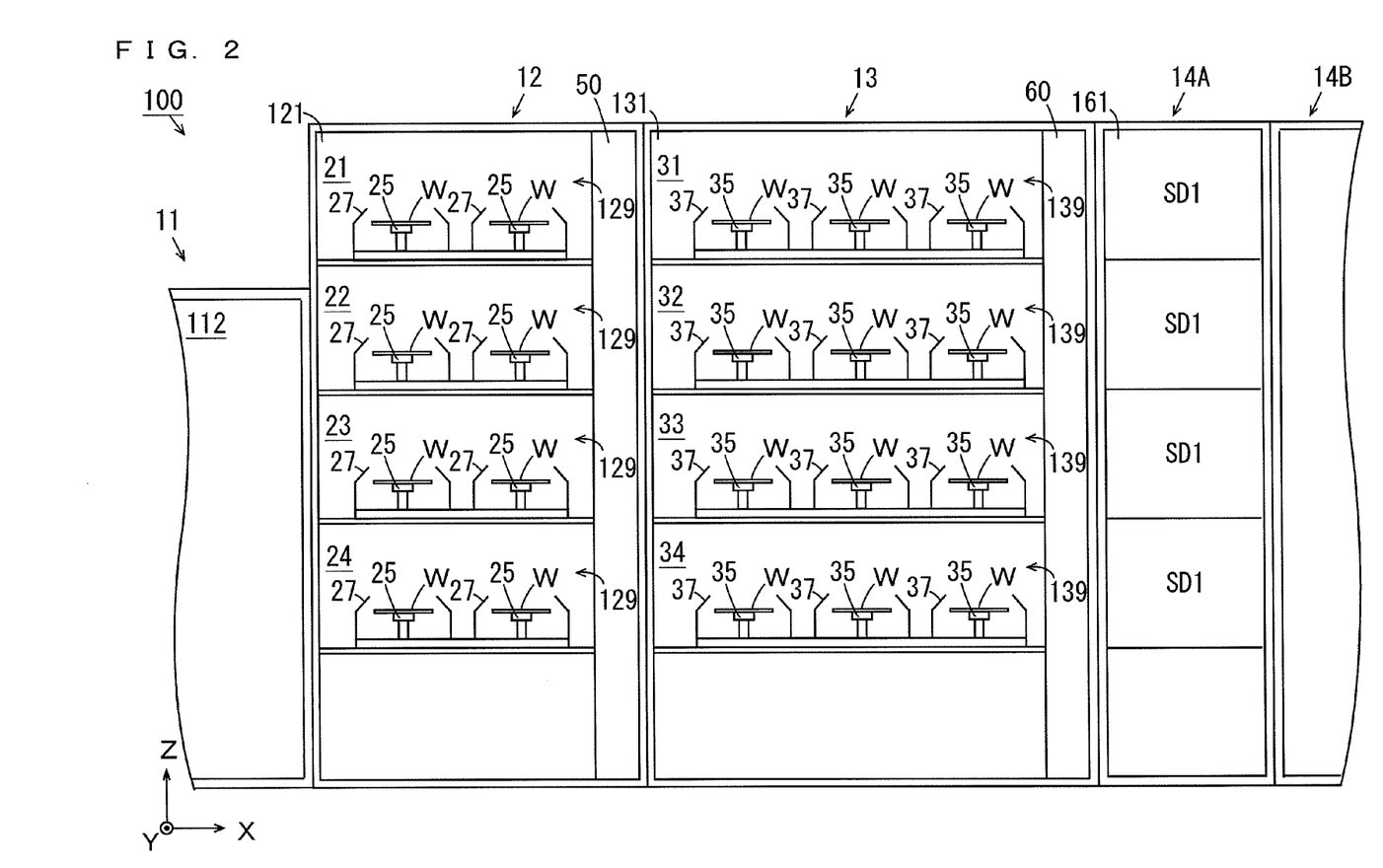
FIG. 2 is a schematic side view of the substrate processing apparatus mainly showing a coating processing section, a development processing section and a cleaning/drying processing section of FIG. 1.

(2) Configuration of Coating Processing Section and Development Processing Section FIG. 2 is a schematic side view of the substrate processing apparatus 100 mainly showing the coating processing section 121, the development processing section 131 and the cleaning/drying processing section 161 of FIG. 1.

As shown in FIG. 2, in the coating processing section 121, coating processing chambers 21, 22, 23, 24 are provided in a stack. In the development processing section 131, development processing chambers 31, 32, 33, 34 are provided in a stack. In each of the coating processing chambers 21 to 24, a coating processing unit 129 is provided. In each of the development processing chambers 31 to 34, a development processing unit 139 is provided.

Each coating processing unit 129 includes spin chucks 25 that hold the substrates W and cups 27 provided to cover the surroundings of the spin chucks 25. In the present embodiment, two pairs of the spin chucks 25 and the cups 27 are provided at each coating processing unit 129. The spin chuck 25 is driven to be rotated by a driving device that is not shown (an electric motor, for example). Further, as shown in FIG. 1, each coating processing unit 129 includes a plurality of processing liquid nozzles 28 that discharge a processing liquid and a nozzle transport mechanism 29 that moves these processing liquid nozzles 28.

In the coating processing unit 129, the spin chuck 25 is rotated by the driving device (not shown), and any one of the plurality of nozzles 28 is moved to a position above the substrate W by the nozzle transport mechanism 29, and a processing liquid is discharged from the nozzle 28. Thus, the processing liquid is applied on the substrate W. Further, a rinse liquid is discharged at a peripheral edge of the substrate W from an edge rinse nozzle (not shown). Thus, the processing liquid that adheres to the peripheral edge of the substrate W is removed.

In the coating processing unit 129 in the coating processing chamber 22, 24, a processing liquid for an anti-reflection film is supplied to the substrate W from the nozzle 28. In the coating processing unit 129 in the coating processing chamber 21, 23, a processing liquid for a resist film is supplied to the substrate W from the nozzle 28.

Each development processing unit 139 includes spin chucks 35 and cups 37 similarly to the coating processing unit 129. In the present embodiment, three pairs of the spin chuck 35 and the cup 37 are provided in each development processing unit 139. The spin chuck 35 is driven to be rotated by a driving device that is not shown (an electric motor, for example). Further, as shown in FIG. 1, the development processing unit 139 includes two development nozzles 38 that discharge a development liquid and a moving mechanism 39 that moves the development nozzle 38 in the X direction.

In the development processing unit 139, the spin chuck 35 is rotated by a driving device (not shown) and the one development nozzle 38 supplies the development liquid to each substrate W while moving in the X direction. Thereafter, the other development nozzle 38 supplies the development liquid to each substrate W while moving. In this case, the development liquid is supplied to the substrate W, so that development processing for the substrate W is performed. Further, in the present embodiment, development liquids that are different from each other are discharged from the two development nozzles 38. Thus, two types of the development liquids can be supplied to each substrate W.

A plurality (four in this example) of cleaning/drying processing units SD1 are provided in the cleaning/drying processing section 161. In the cleaning/drying processing unit SD1, cleaning and drying processing for the substrate W before the exposure processing are performed.

As shown in FIGS. 1 and 2, a fluid box 50 is provided in the coating processing section 121 to be adjacent to the development processing section 131. Similarly, a fluid box 60 is provided in the development processing section 131 to be adjacent to the cleaning/drying processing block 14A. The fluid box 50 and the fluid box 60 each house fluid related elements such as pipes, joints, valves, flowmeters, regulators, pumps and temperature adjusters used to supply a chemical liquid to the coating processing units 129 and the development processing units 139 and discharge the liquid and air out of the coating processing units 129 and the development processing units 139.

(3) Configuration of Thermal Processing Section

Figure 3:
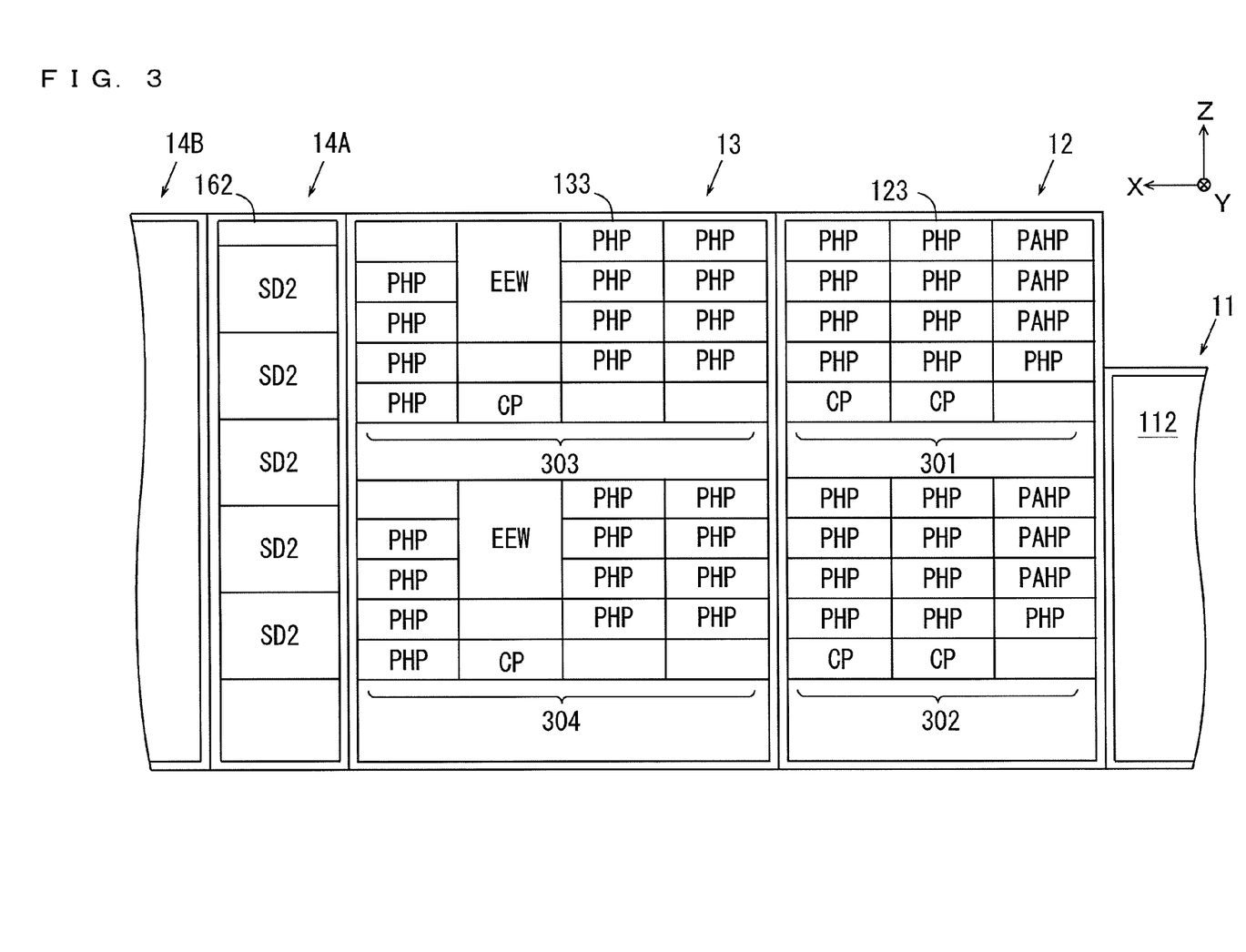
FIG. 3 is a schematic side view of the substrate processing apparatus mainly showing a thermal processing section and a cleaning/drying processing section of FIG. 1.

FIG. 3 is a schematic side view of the substrate processing apparatus 100 mainly showing the thermal processing sections 123, 133 and the cleaning/drying processing section 162 of FIG. 1.

As shown in FIG. 3, the thermal processing section 123 has an upper thermal processing section 301 provided above, and a lower thermal processing section 302 provided below. In each of the upper thermal processing section 301 and the lower thermal processing section 302, a plurality of thermal processing units PHP, a plurality of adhesion reinforcement processing units PAHP and a plurality of cooling units CP are provided.

In the thermal processing unit PHP, heating processing and cooling processing for the substrate W are performed. Hereinafter, the heating processing and the cooling processing in the thermal processing unit PHP are simply referred to as thermal processing. Adhesion reinforcement processing for improving adhesion between the substrate W and the anti-reflection film is performed in the adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section 303 provided above and a lower thermal processing section 304 provided below. A cooling unit CP, an edge exposure/inspection unit EEW and a plurality of thermal processing units PHP are provided in each of the upper thermal processing section 303 and the lower thermal processing section 304. In the edge exposure/inspection unit EEW, an appearance inspection for the substrate W is performed, and the exposure processing for the peripheral edge of the substrate W (edge exposure processing) is performed. In the upper thermal processing section 303 and the lower thermal processing section 304, each thermal processing unit PHP provided to be adjacent to the cleaning/drying processing block 14A is configured to be capable of carrying in the substrate W from the cleaning/drying processing block 14A.

A plurality (four in this example) of cleaning/drying processing units SD2 are provided in the cleaning/drying processing section 162. In the cleaning/drying processing unit SD2, the cleaning and drying processing for the substrate W after the exposure processing are performed.

(4) Configuration of Transport Section

Figure 4:
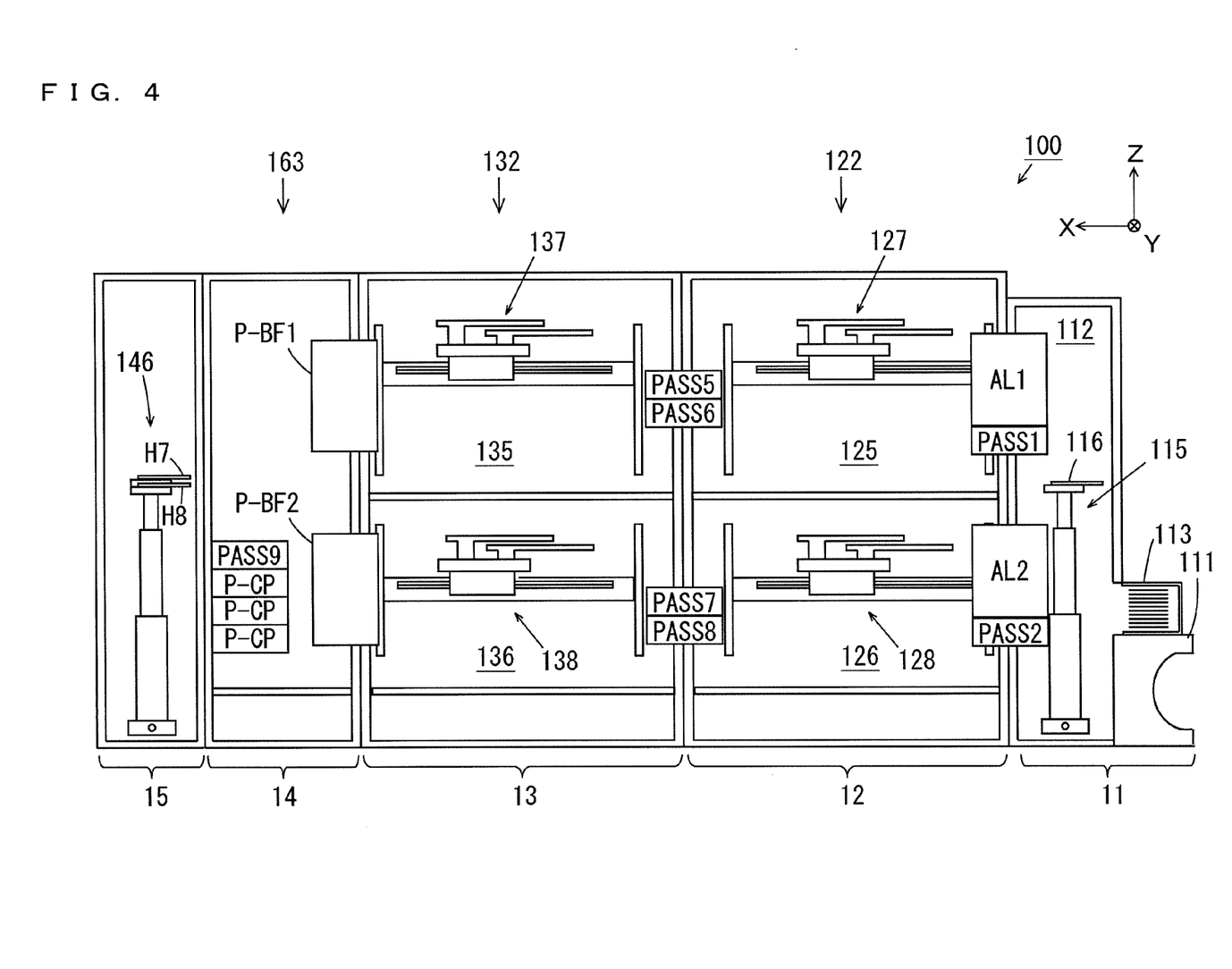
FIG. 4 is a side view mainly showing a transport section of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The transport mechanism 127 is provided in the upper transport chamber 125, and the transport mechanism 128 is provided in the lower transport chamber 126. Further, the transport mechanism 137 is provided in the upper transport chamber 135, and the transport mechanism 138 is provided in the lower transport chamber 136.

The aligner AL1 and the substrate platform PASS1 are provided between the transport section 112 and the upper transport chamber 125, and the aligner AL2 and the substrate platform PASS2 are provided between the transport section 112 and the lower transport chamber 126. Substrate platforms PASS5, PASS6 are provided between the upper transport chamber 125 and the upper transport chamber 135, and substrate platforms PASS7, PASS8 are provided between the lower transport chamber 126 and the lower transport chamber 136.

The placement/buffer section P-BF1 is provided between the upper transport chamber 135 and the transport section 163, and the placement/buffer section P-BF2 is provided between the lower transport section 136 and the transport section 163. The substrate platform PASS9 and the plurality of placement/cooling platforms P-CP are provided to be adjacent to the interface block 15 in the transport section 163.

The transport mechanism 127 is configured to be capable of transporting the substrate W among the aligner AL1, the substrate platforms PASS1, PASS5, PASS6, the coating processing chambers 21, 22 (FIG. 2) and the upper thermal processing section 301 (FIG. 3). The transport mechanism 128 is configured to be capable of transporting the substrate W among the aligner AL2, the substrate platforms PASS2, PASS7, PASS8, the coating processing chambers 23, 24 (FIG. 2) and the lower thermal processing section 302 (FIG. 3).

The transport mechanism 137 is configured to be capable of transporting the substrate W among the substrate platforms PASS5, PASS6, the placement/buffer section P-BF1, the development processing chambers 31, 32 (FIG. 2) and the upper thermal processing section 303 (FIG. 3). The transport mechanism 138 is configured to be capable of transporting the substrate W among the substrate platforms PASS7, PASS8, the placement/buffer section P-BF2, the development processing chambers 33, 34 (FIG. 2) and the lower thermal processing section 304 (FIG. 3).

The transport mechanisms 127, 128, 137, 138 are preferably configured to transport the substrate W while holding and sucking the back surface of the substrate W. Thus, at the time of transporting the substrate W, a position of the notch NT with respect to the center of the substrate W is prevented from changing.

(5) Operation

The operation of the substrate processing apparatus 100 will be described with reference to FIGS. 1 to 4. The carrier 113 in which the unprocessed substrates W are stored is placed on the carrier platform 111 (FIG. 1) in the indexer block 11. The transport mechanism 115 transports the unprocessed substrate W from the carrier 113 to the aligner AU, AL2 (FIG. 4). In the aligner AL1, AL2, alignment for the substrate W is performed. Further, the transport mechanism 115 transports the processed substrate W placed on the substrate platform PASS1, PASS2(FIG. 4) to the carrier 113.

In the first processing block 12, the transport mechanism 127 (FIG. 4) sequentially transports the substrate W aligned by the aligner AL1 (FIG. 4) to the adhesion reinforcement processing unit PAHP (FIG. 3), the cooling unit CP (FIG. 3), the coating processing chamber 22 (FIG. 2), the thermal processing unit PHP (FIG. 3), the cooling unit CP (FIG. 3), the coating processing chamber 21 (FIG. 2), the thermal processing unit PHP (FIG. 3) and the substrate platform PASS5 (FIG. 4).

In this case, after the adhesion reinforcement processing is performed on the substrate W in the adhesion reinforcement processing unit PAHP, the substrate W is cooled to a temperature suitable for formation of the anti-reflection film in the cooling unit CP. Next, an anti-reflection film is formed on the substrate W by the coating processing unit 129 (FIG. 2) in the coating processing chamber 22. Subsequently, after the thermal processing for the substrate W is performed in the thermal processing unit PHP, the substrate W is cooled in the cooling unit CP to a temperature suitable for the formation of the resist film. Next, in the coating processing chamber 21, the resist film is formed on the substrate W by the coating processing unit 129 (FIG. 2). Thereafter, the thermal processing for the substrate W is performed in the thermal processing unit PHP, and the substrate W is placed on the substrate platform PASS5.

Further, the transport mechanism 127 transports the substrate W after the development processing placed on the substrate platform PASS6 (FIG. 4) to the substrate platform PASS1(FIG. 4).

The transport mechanism 128 (FIG. 4) sequentially transports the substrate W aligned by the aligner AL2 (FIG. 4) to the adhesion reinforcement processing unit PAHP (FIG. 3), the cooling unit CP (FIG. 3), the coating processing chamber 24 (FIG. 2), the thermal processing unit PHP (FIG. 3), the cooling unit CP (FIG. 3), the coating processing chamber 23 (FIG. 2), the thermal processing unit PHP (FIG. 3) and the substrate platform PASS7 (FIG. 4). Further, the transport mechanism 128 (FIG. 4) transports the substrate W after the development processing placed on the substrate platform PASS8(FIG. 4) to the substrate platform PASS2(FIG. 4). The processing contents of the substrate W in the coating processing chambers 23, 24 (FIG. 2) and the lower thermal processing section 302 (FIG. 3) are similar to the processing contents of the substrate W in the above-mentioned coating processing chambers 21, 22 (FIG. 2) and the upper thermal processing section 301 (FIG. 3).

In the second processing block 13, the transport mechanism 137 (FIG. 4) sequentially transports the substrate W after the resist film formation placed on the substrate platform PASS5 (FIG. 4) to the edge exposure/inspection unit EEW (FIG. 3) and the placement/buffer section P-BF1 (FIG. 4).

In this case, in the edge exposure/inspection unit EEW, the appearance inspection for the substrate W is performed. Specifically, the appearance of the surface of the substrate W is captured by a capture device such as a CCD (Charge-Coupled Device) image sensor. The surface of the substrate W refers to a surface of the substrate W on which the anti-reflection film and the resist film are formed. Thus, the image data of the surface of the substrate W is produced. The controller 114 of FIG. 1 inspects the state of the surface of the substrate W based on the produced image data, and corrects the operation of each constituent element of the substrate processing apparatus 100 regarding the film formation processing depending on the inspection result.

For example, if the substrate W is held by the spin chuck 25 with the center of the substrate W being shifted from the rotational center of the spin chuck 25, a film formed at the substrate W (the anti-reflection film or the resist film) is not symmetric but eccentric with the center of the substrate W. Therefore, the controller 114 determines whether or not the film formed at the substrate W is symmetric with the center of the substrate W based on the image data. When the film formed at the substrate W is not symmetric with the center of the substrate W, the controller 114 corrects the placement position of the substrate W at the spin chuck 25 by the transport mechanisms 127, 128 such that the center of the substrate W coincides with the rotational center of the spin chuck 25.

Further, in each coating processing unit 129, if the amount of a rinse liquid discharged from the edge rinse nozzle is large, the width of a region at the peripheral edge of the substrate W (hereinafter referred to as an edge cut width) in which a film is not formed becomes larger than the appropriate range. In contrast, if the amount of the rinse liquid discharged from the edge rinse nozzle is small, the edge cut width becomes smaller than the appropriate range. Therefore, the controller 114 determines whether or not the edge cut width is in a predetermined appropriate range based on the image data. If the edge cut width is out of the appropriate range, the controller 114 corrects the amount of the rinse liquid discharged from the edge rinse nozzle such that the edge cut width is in the predetermined appropriate range.

After such an appearance inspection, the edge exposure processing is performed on the substrate W. When the state of the surface of the substrate W is determined to be inappropriate in the appearance inspection, subsequent processing does not have to be performed on the substrate W. The substrate W is left for a certain period of time while being stored in the placement/buffer section P-BF1, P-BF2, for example, and is collected by a worker between the end of the processing for one lot and the start of the processing for the next lot and the like.

Further, the transport mechanism 137 (FIG. 4) takes out the substrate W after the exposure processing and the thermal processing from the thermal processing unit PHP (FIG. 3) adjacent to the cleaning/drying processing block 14A, and sequentially transports the substrate W to any one of the cooling unit CP (FIG. 3) and one of the development processing chambers 31, 32 (FIG. 2), the thermal processing unit PHP (FIG. 3) and the substrate platform PASS6 (FIG. 4).

In this case, in the cooling unit CP, the development processing for the substrate W is performed by the development processing unit 139 in one of the development processing chambers 31, 32 after the substrate W is cooled to a temperature suitable for the development processing. Thereafter, in the thermal processing unit PHP, the thermal processing for the substrate W is performed, and the substrate W is placed on the substrate platform PASS6.

The transport mechanism 138 (FIG. 4) sequentially transports the substrate W after the resist film formation placed on the substrate platform PASS7 (FIG. 4) to the edge exposure/inspection unit EEW (FIG. 3) and the placement/buffer section P-BF2 (FIG. 4). Further, the transport mechanism 138 (FIG. 4) takes out the substrate W after the exposure processing and the thermal processing from the thermal processing unit PHP (FIG. 3) that is adjacent to the back surface cleaning processing block 14, and sequentially transports the substrate W to one of the cooling unit CP (FIG. 3) and one of the development processing chambers 33, 34 (FIG. 2), the thermal processing unit PHP (FIG. 3) and the substrate platform PASS8 (FIG. 4). The processing contents for the substrate W in the development processing chambers 33, 34 and the lower thermal processing section 304 are similar to the processing contents for the substrate W in the above-mentioned development processing chambers 31, 32 and the upper thermal processing section 303.

In the cleaning/drying processing block 14A, the transport mechanism 141 (FIG. 1) sequentially transports the substrate W placed on the placement/buffer section P-BF1, P-BF2 (FIG. 4) to the cleaning/drying processing unit SD1 (FIG. 2) in the cleaning/drying processing section 161 and the placement/cooling platform P-CP (FIG. 4). In this case, the substrate W is cooled in the placement/cooling platform P-CP to a temperature suitable for the exposure processing in the exposure device 15 (FIGS. 1 to 3) after the cleaning and drying processing for the substrate W are performed in the cleaning/drying processing unit SD1.

The transport mechanism 142 (FIG. 1) transports the substrate W after the exposure processing placed on the substrate platform PASS9(FIG. 4) to the cleaning/drying processing unit SD2 (FIG. 3) in the cleaning/drying processing section 162, and transports the substrate W after the cleaning and drying processing to the thermal processing unit PHP (FIG. 3) in the upper thermal processing section 303 or the thermal processing unit PHP (FIG. 3) in the lower thermal processing section 304 from the cleaning/drying processing unit SD2. In this thermal processing unit PHP, post-exposure bake (PEB) processing is performed. In the interface block 15, the transport mechanism 146 (FIG. 1) transports the substrate W before the exposure processing placed on the placement/cooling platform P-CP (FIG. 4) to the substrate inlet 15a (FIG. 1) of the exposure device 15. Further, the transport mechanism 146 (FIG. 1) takes out the substrate W after the exposure processing from the substrate outlet 15b (FIG. 1) of the exposure device 15, and transports the substrate W to the substrate platform PASS9 (FIG. 4).

When an exposure transport section 200 cannot receive the substrate W, the substrate W before the exposure processing is temporarily stored in the placement/buffer section P-BF1, P-BF2. Further, when the development processing unit 139 (FIG. 2) in the second processing block 13 cannot receive the substrate W after the exposure processing, the substrate W after the exposure processing is temporarily stored in the placement/buffer section P-BF1, P-BF2.

In the present embodiment, processing for the substrate W in the coating processing chambers 21, 22, the development processing chambers 31, 32 and the upper thermal processing sections 301, 303 that are provided above, and the processing for the substrate W in the coating processing chambers 23, 24, the development processing chambers 33, 34 and the lower thermal processing sections 302, 304 that are provided below can be concurrently performed. Thus, it is possible to improve throughput without increasing the footprint.

(6) Aligner (6-1) Configuration

Figure 5:
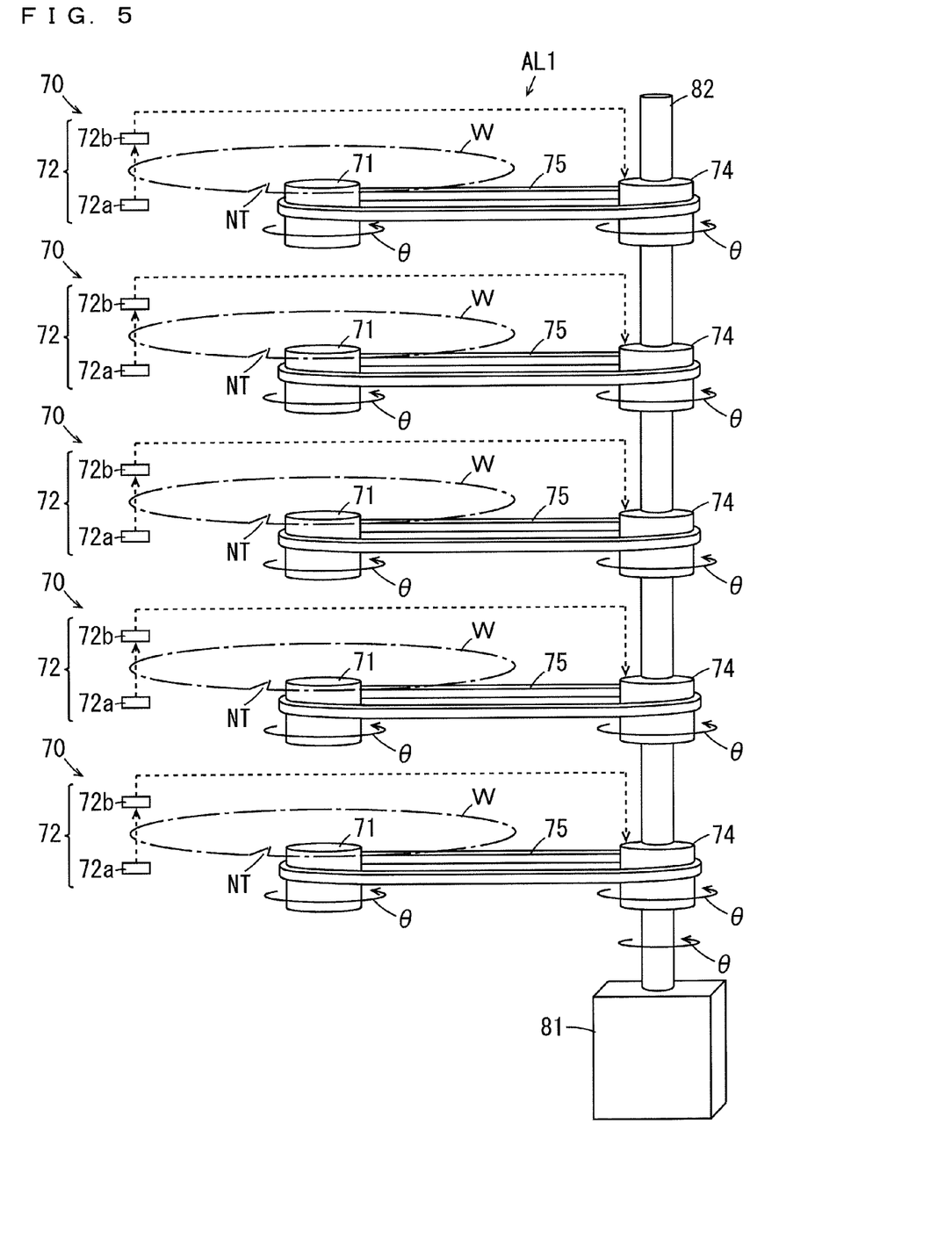
FIG. 5 is a schematic perspective view for explaining the configuration of an aligner.

FIG. 5 is a schematic perspective view for explaining the configuration of the aligner AL1. The configuration of the aligner AL2 is similar to the configuration of the aligner AL1 shown in FIG. 5. In the following description, the rotation direction with an axis in the vertical direction (Z direction) as a center is referred to as a θ direction.

As shown in FIG. 5, the aligner AL1 includes a plurality (five in this example) of substrate rotators 70. Each substrate rotator 70 includes a holder 71, a notch detector 72, an electromagnetic clutch 74 and a driving belt 75. Each holder 71 sucks the back surface (a surface on which a film is not formed) of the substrate W under vacuum and horizontally holds the substrate W. Each holder 71 is provided to be rotatable in the θ direction. Further, the plurality of holders 71 are arranged in the vertical direction such that the rotational center axes of the plurality of holders 71 match each other.

Each notch detector 72 includes a light emitter 72a and a light receiver 72b. A detection position is set between the light emitter 72a and the light receiver 72b. The light emitter 72a and the light receiver 72b are arranged such that the peripheral edge of the substrate W held by the holder 71 matches the detection position. The peripheral edge of the substrate W refers to an annular region having a constant width along the outer peripheral end of the substrate W. Further, each light emitter 72a and each light receiver 72b are arranged such that the detection positions of the plurality of notch detectors 72 are positioned on the common vertical axis.

Each notch detector 72 detects the notch NT formed at the substrate W, and supplies the detection result to the corresponding electromagnetic clutch 74 as a detection signal. In the present example, a detection signal becomes high when the light emitted from the light emitter 72a is incident on the light receiver 72b, and the detection signal becomes low when the light emitted from the light emitter 72a is not incident on the light receiver 72b. Specifically, when a region at the peripheral edge of the substrate W except for the notch NT of the substrate W is at the detection position, the light emitted from the light emitter 72a is shielded by the substrate W and not incident on the light receiver 72b. Therefore, the detection signal becomes low. On the other hand, when the notch NT of the substrate W is at the detection position, the light emitted from the light emitter 72a is incident on the light receiver 72b through the notch NT. Therefore, the detection signal becomes high. Further, even when the substrate W is not placed on the holder 71, the light emitted from the light emitter 72a is incident on the light receiver 72b without being shielded by the substrate W. Therefore, the detection signal becomes high.

A shaft member 82 is provided to extend in the vertical direction on the side of the plurality of holders 71. One end of the shaft member 82 is connected to a motor 81. The shaft member 82 is continuously rotated in the a direction by the motor 81.

Each electromagnetic clutch 74 includes an inner periphery and an outer periphery. The inner periphery of each electromagnetic clutch 74 is fixed to the shaft member 82 substantially at the same height as the corresponding holder 71. Each electromagnetic clutch 74 switches to the connection state in which the rotational force of the inner periphery is transmitted to the outer periphery and the disconnection state in which the rotational force of the inner periphery is not transmitted to the outer periphery according to the detection signal supplied from the notch detector 72. When the electromagnetic clutch 74 is in the connection state, the outer periphery of the electromagnetic clutch 74 is integrally rotated with the shaft member 82 in the θ direction. On the other hand, when the electromagnetic clutch 74 is in the disconnection state, the outer periphery of the electromagnetic clutch 74 is not integrally rotated with the shaft member 82.

The driving belt 75 with no end is rolled onto the outer periphery of the holder 71 and the electromagnetic clutch 74 that correspond to each other. Thus, when the electromagnetic clutch 74 is in the connection state, the rotational force of the shaft member 82 is transmitted to the holder 71 via the driving belt 75. In order to prevent the rotation of the outer periphery of the electromagnetic clutch 74 and the holder 71 from continuing due to inertia after the electromagnetic clutch 74 switches from the connection state to the disconnection state, a friction member that supplies constant friction force to at least one of the outer periphery of the electromagnetic clutch 74 and the holder 71 may be provided.

Figure 6:
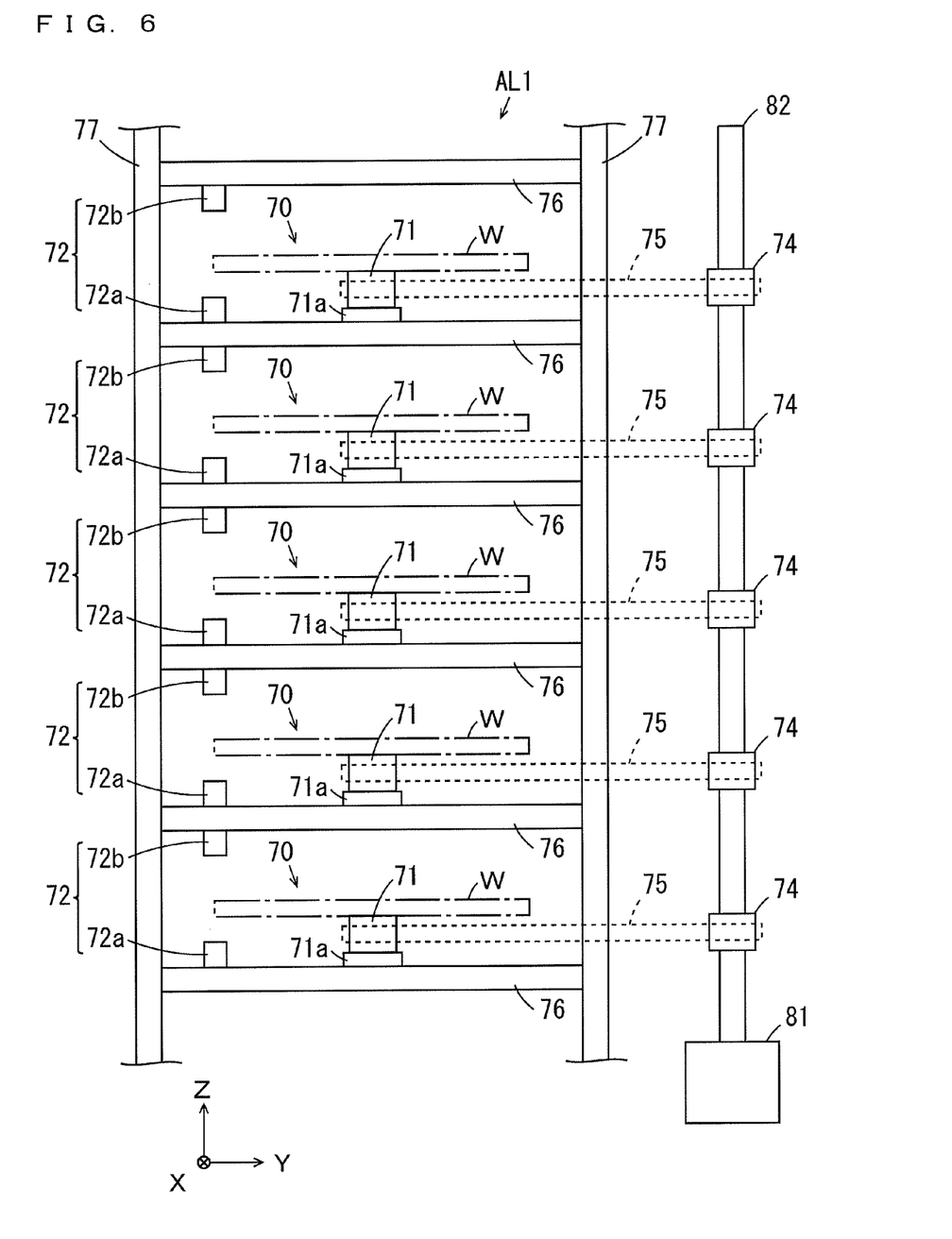
FIG. 6 is a side view showing a specific alignment example of the aligner.
Figure 7:
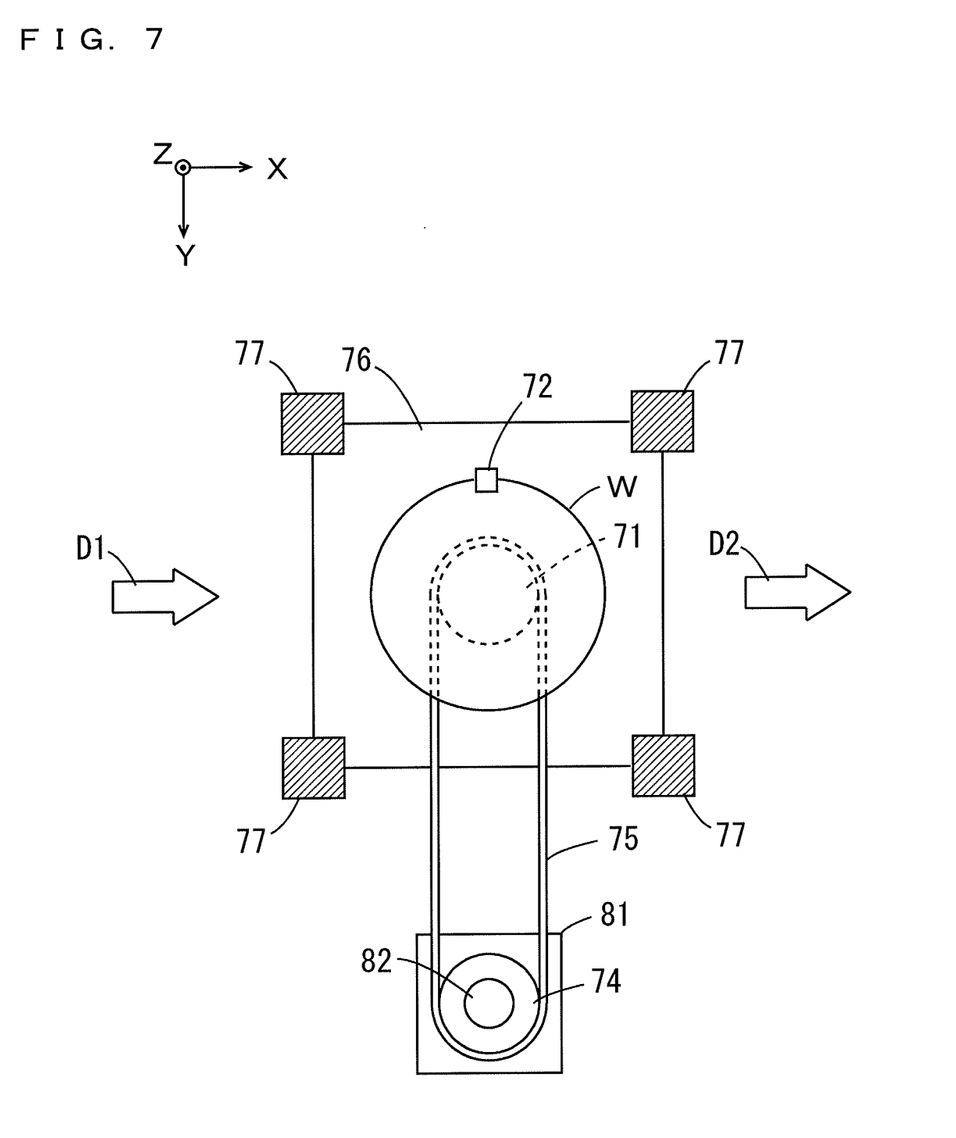
FIG. 7 is a plan view showing the specific alignment example of the aligner.

FIGS. 6 and 7 are a side view and a plan view showing a specific example of arrangement of the aligner AL1. In the examples of FIGS. 6 and 7, a plurality of shelf members 76 are supported by four supports 77 to be placed one above the other. Each holder 71 and each notch detector 72 are arranged between each two adjacent shelf members 76. Each holder 71 is attached to the upper surface of the lower shelf member 76 of the two adjacent shelf members 76 via a bearing member 71a. The light emitter 72a of each notch detector 72 is attached to the upper surface of the lower shelf member 76 of the two shelf members 76 that are adjacent to each other in the vertical direction, and the light receiver 72b is attached to the lower surface of the upper shelf member 76.

Further, the motor 81 and the shaft member 82 are arranged so as not to interfere with the transportation of the substrate W to each holder 71 and the transportation of the substrate W from each holder 71. Specifically, as shown in FIG. 7, the motor 81 and the shaft member 82 are arranged to be adjacent to each holder 71 in a direction that intersects with each of a transport direction D1 of the substrate W to each holder 71 by the transport mechanism 115 (FIG. 4), and a transport direction D2 of the substrate W from each holder 71 by the transport mechanism 127 (FIG. 4). In the present embodiment, the transport directions D1, D2 respectively match the X direction, and the motor 81 and the shaft member 82 are arranged to be adjacent to each holder 71 in the Y direction.

(6-2) Operation

Figure 8:
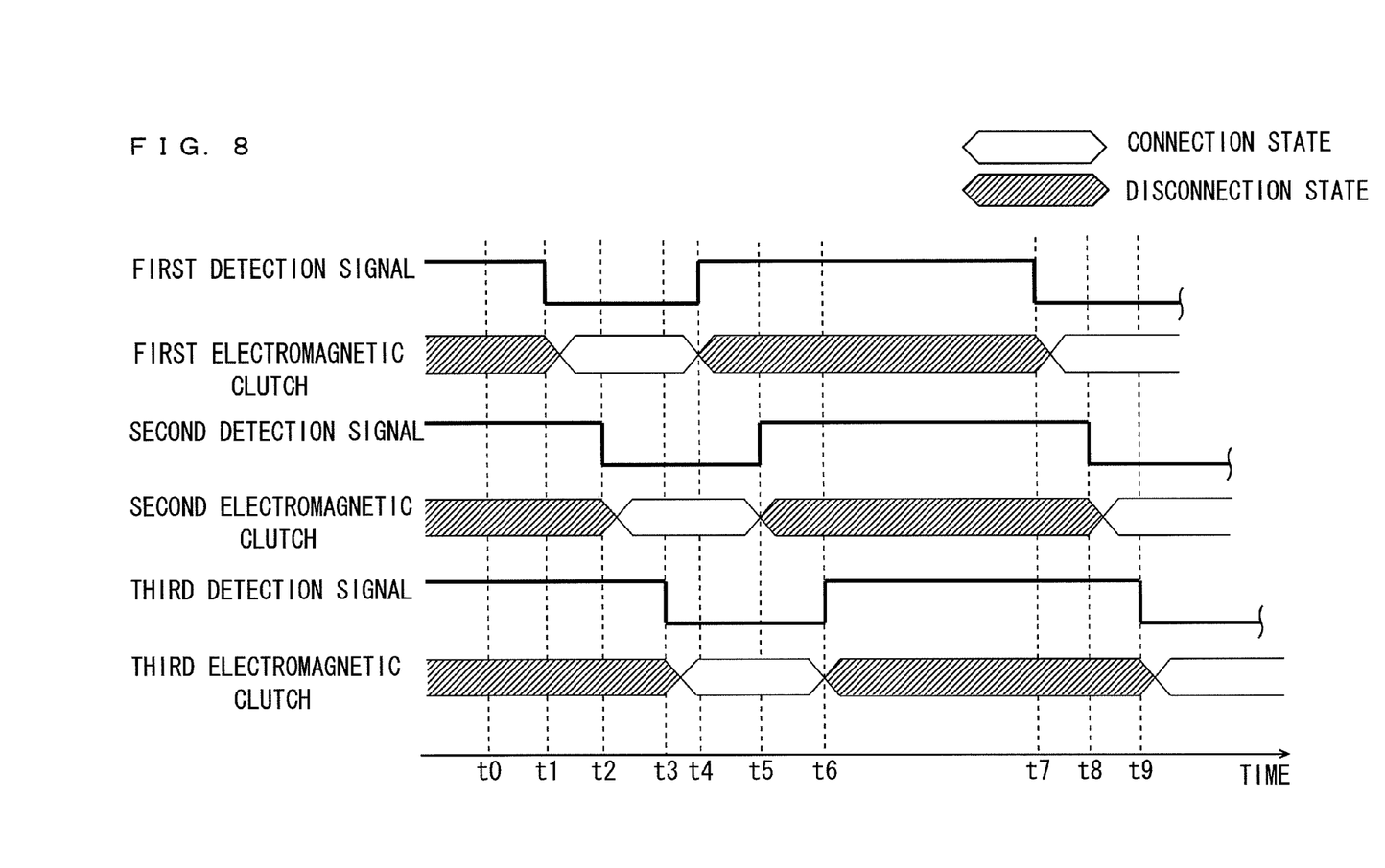
FIG. 8 is a diagram for explaining the operation of the aligner.

FIG. 8 is a diagram for explaining the operation of the aligner AL1. The operation of the aligner AL2 is similar to the operation of the aligner AL1 shown in FIG. 8. In FIG. 8, a change in detection signal in the three substrate rotators 70 of the plurality of substrate rotators 70 and a change in state of the electromagnetic clutch 74 are shown.

Hereinafter, the detection signals in the three substrate rotators 70 are respectively referred to as a first detection signal, a second detection signal and a third detection signal, and the electromagnetic clutches 74 of the three substrate rotators 70 are respectively referred to as a first electromagnetic clutch 74, a second electromagnetic clutch 74 and a third electromagnetic clutch 74. Further, the holders 71 of the three substrate rotators 70 are respectively referred to as a first holder 71, a second holder 71 and a third holder 71, and the notch detectors 72 of the three substrate rotators 70 are respectively referred to as a first notch detector 72, a second notch detector 72 and a third notch detector 72.

In the example of FIG. 8, at a time point t0, the substrate W is not placed on any one of the first to third holders 71. Therefore, the first to third detection signals are high. In this case, each of the first to third electromagnetic clutches 74 is kept in the disconnection state. Therefore, the outer peripheries of the first to third electromagnetic clutches 74 are not integrally rotated with the shaft member 82, and the first to third holders 71 are not rotated either. The shaft member 82 is continuously rotated.

At a time point t1, the substrate W is placed on the first holder 71, and the substrate W is held by the first holder 71. In this case, a region at the peripheral edge of the substrate W except for the notch NT is at the detection position of the first notch detector 72. Therefore, the first detection signal becomes low. In response to that, the first electromagnetic clutch 74 switches to the connection state. Thus, the outer periphery of the first electromagnetic clutch 74 is integrally rotated with the shaft member 82. The rotation of the first electromagnetic clutch 74 is transmitted to the first holder 71 via the driving belt 75. Thus, the first holder 71 is rotated, so that the substrate W held by the first holder 71 is rotated.

Each electromagnetic clutch 74 does not switch to the connection state at a time point at which the detection signal switches to low, but switches to the connection state after a specified time period has elapsed since the detection signal switches to low. Thus, the rotation of the holder 71 is prevented from being started with substrate W not being held by the holder 71.

At a time point t2, the substrate W is placed on the second holder 71, and the substrate W is held by the second holder 71. In this case, a region at the peripheral edge of the substrate W except for the notch NT is at the detection position of the second notch detector 72. Therefore, the second detection signal becomes low. In response to that, the second electromagnetic clutch 74 switches to the connection state. Thus, the outer periphery of the second magnetic clutch 74 is integrally rotated with the shaft member 82. The rotation of the second electromagnetic clutch 74 is transmitted to the second holder 71 via the driving belt 75. Thus, the second holder 71 is rotated, and the substrate W held by the second holder 71 is rotated.

Next, at a time point t3, the substrate W is placed on the third holder 71, and the substrate W is held by the third holder 71. In this case, a region at the peripheral edge of the substrate W except for the notch NT is at the detection position of the third notch detector 72. Therefore, the third detection signal becomes low. In response to that, the third electromagnetic clutch 74 switches to the connection state. Thus, the outer periphery of the third electromagnetic clutch 74 is integrally rotated with the shaft member 82. The rotation of the third electromagnetic clutch 74 is transmitted to the third holder 71 via the driving belt 75. Thus, the third holder 71 is rotated, and the substrate W held by the third holder 71 is rotated.

At a time point t4, the notch NT of the substrate W rotated by the first holder 71 reaches the detection position of the first notch detector 72. Thus, the first detection signal becomes high. In response to that, the first electromagnetic clutch 74 switches to the disconnection state. Thus, the rotation of the outer periphery of the first electromagnetic clutch 74 is stopped, and the rotation of the first holder 71 is stopped. Therefore, in a case in which the notch NT of the substrate W is at the detection position of the first notch detector 72, the rotation of the substrate W is stopped. Thereafter, the substrate W is received by the transport mechanism 127 of FIG. 1 from the first holder 71.

At a time point t5, the notch NT of the substrate W rotated by the second holder 71 reaches the detection position of the second notch detector 72. Thus, the second detection signal becomes high. In response to that, the second electromagnetic clutch 74 switches to the disconnection state. Thus, the rotation of the outer periphery of the second electromagnetic clutch 74 is stopped, and the rotation of the second holder 71 is stopped. Therefore, the rotation of the substrate W is stopped with the notch NT of the substrate W being at the detection position of the second notch detector 72. Thereafter, the substrate W is received by the transport mechanism 127 of FIG. 1 from the second holder 71.

At a time point t6, the notch NT of the substrate W rotated by the third holder 71 reaches the detection position of the third notch detector 72. Thus, the third detection signal becomes high. In response to that, the third electromagnetic clutch 74 switches to the disconnection state. Thus, the rotation of the outer periphery of the third electromagnetic clutch 74 is stopped, and the rotation of the third holder 71 is stopped. Therefore, the rotation of the substrate W is stopped with the notch NT of the substrate W being at the detection position of the third notch detector 72. Thereafter, the substrate W is received from the third holder 71 by the transport mechanism 127 of FIG. 1.

In this manner, in each of the plurality of substrate rotators 70, alignment for the substrate W is performed such that the notch NT of the substrate W matches the detection position of the notch detector 72. As described above, the rotational center axes of the plurality of holders 71 match each other in the vertical direction, and the detection positions of the plurality of notch detectors 72 are aligned on the common vertical axis. Thus, in the plurality of substrate rotators 70, the notches NT of the substrates W are aligned in the same direction with respect to the center of each substrate W. In each substrate rotator 70, such operation is successively repeated.

In FIG. 8, after each detection signal becomes high at the time point t 4, the time point t5 and the time point t6, each detection signal is kept high until the next substrate W is placed on the first holder 71 (a time point t7, a time point t8 and a time point t9 of FIG. 8). However, in actuality, at the time of transporting the substrate W that is received by the transport mechanism 127 (FIG. 1) from the holder 71, because part of the substrate W passes through the detection position of the notch detector 72, the first detection signal temporarily becomes low.

In the present example, in a case in which a time period, from the time at which the detection signal switches to low until the time at which the detection signal switches to high, is shorter than a constant time period, the electromagnetic clutch 74 is kept in the disconnection state. Thus, even if the detection signal temporarily becomes low at the time of transporting the substrate W after the alignment, the electromagnetic clutch 74 is kept in the disconnection state.

Further, in the example of FIG. 8, when the substrate W is placed on each holder 71, a region at the peripheral edge of the substrate W except for the notch NT is positioned at the detection position of each notch detector 72. However, in actuality, when the substrate W is placed on the holder 71, the notch NT of the substrate W may be positioned at the detection position of the notch detector 72. In this case, it is difficult to detect the placement of the substrate W on the holder 71 based on the detection signal output from the notch detector 72.

For example, a suction path for sucking the substrate W under vacuum is provided at each holder 71. A pressure sensor may be attached to the suction path, and the placement of the substrate W on the holder 71 may be detected based on a change in pressure (suction pressure) detected by the pressure sensor. When the placement of the substrate W on the holder 71 is detected, the electromagnetic clutch 74 switches to the connection state, and the substrate W is rotated until the notch NT of the substrate W is detected by the notch detector 72 anew.

Further, in a case in which a time point at which the substrate W is to be placed on each holder 71 is determined in advance, the electromagnetic clutch 74 may switch to the connection state at the time point, and each holder 71 may be rotated by a constant angle. The constant angle is set to be not less than an angle (five degrees, for example) at which the notch NT is formed in the circumferential direction of the substrate W. In this case, it is possible to reliably determine whether or not the substrate W is placed on the holder 71. When the substrate W is placed on the holder 71, the substrate W is continuously rotated until the notch NT of the substrate W is detected by the notch detector 72 anew.

(7) Effects

In the substrate processing apparatus 100 according to the present embodiment, alignment for the substrate W is performed at the aligners AL1, AL2 before processing is performed on the substrate W. In each of the aligners AL1, AL2, the corresponding electromagnetic clutch 74 switches to the connection state with the substrate W being held by each holder 71, whereby the rotational force of the shaft member 82 is transmitted to the holder 71. Thus, the substrate W held by the holder 71 is rotated. When the notch NT of the substrate W is detected by the corresponding notch detector 72, the corresponding electromagnetic clutch 74 switches to the disconnection state. Thus, the rotation of the substrate W is stopped with the notch NT of the substrate W held by each holder 71 being aligned in a constant direction with respect to the rotational center axis.

In this manner, the rotational force of the common shaft member 82 that is rotated by the common motor 81 is respectively transmitted to the plurality of holders 71 via the plurality of electromagnetic clutches 74, and the rotation of the plurality of holders 71 is respectively stopped at desired time points. Thus, it is possible to concurrently perform the alignment for the plurality of substrates W with a simple configuration without providing the plurality of motors 81.

Further, in the present embodiment, after the alignment for the substrate W is performed by the aligners AL1, AL2, the substrate W is transported to the coating processing section 121 by the transport mechanism 127, 128, and the anti-reflection film and the resist film are formed on the substrate W in the coating processing section 121. In this case, the orientations of the substrates W transported to the coating processing section 121 are unified. Therefore, the anti-reflection film and the resist film can be accurately formed on the substrate W.

Further, in the present embodiment, receiving and transferring of the substrate W between the transport mechanism 115 and the transport mechanism 127, and the transport mechanism 115 and the transport mechanism 128 are performed via the aligners AL1, AL2. Thus, throughput of the substrate processing apparatus 100 is prevented from being reduced.

Further, in the present embodiment, after the anti-reflection film and the resist film are formed on the substrate W, the appearance inspection for the substrate W is performed in the edge exposure/inspection unit EEW. In this case, the orientations of the substrates W transported to the edge exposure/inspection unit EEW are unified. Thus, when the anti-reflection film or the resist film is not symmetric but eccentric with the center of the substrate W, the direction of eccentricity can be accurately specified. Therefore, it is possible to accurately correct the operation of each constituent element of the substrate processing apparatus 100 regarding film formation processing based on the result of the appearance inspection. As a result, processing can be appropriately performed on the substrate W.

(8) Other Embodiments (8-1)

While the detection signal output from the notch detector 72 is directly supplied to the electromagnetic clutch 74, and the electromagnetic clutch 74 switches to the connection state and the disconnection state according to the supplied detection signal in the above-mentioned embodiment, the invention is not limited to this.

For example, the common controller may be provided to correspond to the plurality of notch detectors 72 and the plurality of electromagnetic clutches 74. In this case, the detection signal is supplied to the controller from each of the plurality of notch detectors 72. The controller switches the plurality of electromagnetic clutches 74 to the connection state and the disconnection state based on the supplied detection signal. The controller can appropriately adjust a time point for switching each electromagnetic clutch 74 to the connection state and the disconnection state. Thus, a start time point and a stop time point for the rotation of the substrate W can be appropriately adjusted. The plurality of controllers may be provided to respectively correspond to the plurality of notch detectors 72 and the plurality of electromagnetic clutches 74 instead of the common controller.

(8-2)

While the detection positions of the plurality of notch detectors 72 are positioned on the common vertical axis in the above-mentioned embodiment, the invention is not limited to this. For example, the detection positions of the plurality of notch detectors 72 may be shifted in the circumferential direction of the substrate W. In this case, after the notch NT of the substrate W is detected by each notch detector 72, the substrate W is rotated by a predetermined angle such that the detected notch NT is positioned in a predetermined direction with respect to the rotational center axis of the substrate W. Thus, in the plurality of substrate rotators 70, the notches NT of the plurality of substrates W can be aligned in the same direction with respect to the rotational center axis.

(8-3)

While a transmission switcher is constituted by the electromagnetic clutch 74 and the driving belt 75 in the above-mentioned embodiment, the invention is not limited to this. For example, the transmission switcher may be constituted by a mechanical gear and the like.

(8-4)

While the aligner AL1 is provided between the transport section 112 and the upper transport chamber 125, and the aligner AL2 is provided between the transport section 112 and the lower transport chamber 126 in the above-mentioned embodiment, the arrangement of the aligners AL1, AL2 is not limited to this. For example, the aligner AL1 may be provided between the upper transport chamber 125 and the upper transport chamber 135, and the aligner AL2 may be provided between the lower transport chamber 126 and the lower transport chamber 136. In this case, the alignment for the substrate W is performed in the aligner AL1, AL2 before the substrate W is transported to the coating processing section 121. Thus, the anti-reflection film and the resist film can be accurately formed on the substrate W similarly to the above-mentioned example.

(8-5)

While the above-mentioned embodiment is an example in which the present invention is applied to the substrate processing apparatus 100 that performs the processing for the substrate W before and after the exposure processing, the present invention may be applied to another substrate processing apparatus. For example, the present invention may be applied to the substrate processing apparatus that performs etching processing for the substrate W by supplying an etching liquid to the substrate W. In this case, before the etching processing for the substrate W, the alignment for the substrate W is performed by the alignment device that has the similar configuration as the above-mentioned aligners AL1, AL2. Thus, the etching processing for the substrate W can be more appropriately performed. Further, the appearance inspection for the substrate W is performed after the etching processing for the substrate W and the operation of each constituent element is corrected according to the inspection result, whereby the etching processing for the substrate W can be more accurately performed.

(9) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the aligners AL1, AL2 are examples of an alignment device, the holder 71 is an example of a holder, the notch NT is an example of a portion for detection, the shaft member 82 is an example of a shaft member, the motor 81 is an example of a rotation driver, the notch detector 72 is an example of a detector, the electromagnetic clutch 74 and the driving belt 75 are examples of a transmission switcher, the electromagnetic clutch 74 is an example of a clutch and the driving belt 75 is an example of a transmission member. Further, the coating processing unit 129 is an example of a processing unit, the substrate processing apparatus 100 is an example of a substrate processing apparatus, the transport mechanisms 127, 128 are examples of a first transport mechanism, the first and second processing blocks 12, 13 are examples of a processing section, the indexer block 11 is an example of a carry-in/carry-out section, the aligners AL1, AL2 and the substrate platforms PASS1, PASS2 are examples of an interface section, the carrier platform 111 is an example of a container platform, the carrier 113 is an example of a storing container, the transport mechanism 115 is an example of a second transport mechanism and the edge exposure/inspection unit EEW is an example of an appearance inspection device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing various types of substrates.

I claim:

1. A substrate processing apparatus comprising:
a processing block that includes one or a plurality of chambers and a first transport robot;
an indexer for carrying in a substrate to and carrying out the substrate from the processing block; and
an interface section provided between the processing block and the indexer, wherein
each of the one or the plurality of chambers includes
a substrate holder that holds the substrate, and
a nozzle that performs processing on the substrate by supplying a processing liquid to the substrate held by the substrate holder;
the indexer includes
a container platform on which a storing container that stores the substrate is placed, and
a second transport robot that transports the substrate between the storing container placed on the container platform and the interface section,
the interface section includes an alignment device,
wherein the second transport robot is configured to transport the substrate taken out from the storing container to the alignment device,
the first transport robot is configured to transport the substrate after alignment by the alignment device to the substrate holder,
the alignment device includes:
a plurality of holders respectively configured to be rotatable about a rotational center axis in a vertical direction while holding the substrate having a portion for detection substantially in a horizontal attitude, and arranged to line up in the vertical direction;
a shaft member having an axis that extends in the vertical direction and provided in common for the plurality of holders;
a rotation driver that rotates the shaft member about the axis and is provided in common for the plurality of holders;
a plurality of detectors provided to respectively correspond to the plurality of holders, and respectively configured to detect the portions for detection of the substrates held by the corresponding holders; and a plurality of transmission switchers that are provided to respectively correspond to the plurality of holders, and switch selectively to a transmission state in which rotation of the shaft member is transmitted to the corresponding holder, and a non-transmission state in which rotation of the shaft member is not transmitted to the corresponding holder, wherein the plurality of transmission switchers are configured to switch selectively from the transmission state to the non-transmission state based on a detection result by the corresponding detector when the portion for detection of the substrate rotated by the corresponding holder is positioned in a predetermined common direction with respect to the rotational center axis, the second transport robot is configured to transport the substrate in a first direction on a horizontal plane to each holder of the alignment device, the first transport robot is configured to transport the substrate in the first direction from each holder of the alignment device, and the shaft member and the rotation driver are arranged to be adjacent to the plurality of holders in a second direction that intersects with the first direction on the horizontal plane.

2. The substrate processing apparatus according to claim 1, wherein each transmission switcher includes a clutch attached to the shaft member and a transmission member that transmits rotational force to the corresponding holder from the clutch, and the transmission switcher enters the transmission state when the clutch is connected, and the transmission switcher enters the non-transmission state when the clutch is disconnected.

3. The substrate processing apparatus according to claim 1, wherein the plurality of detectors are arranged to line up on a straight line in the vertical direction parallel to the rotational center axes of the plurality of holders, and are configured to detect the portions for detection when the portions for detection of the substrates rotated by the corresponding respective holders are aligned in the predetermined direction with respect to the rotational center axis, and the plurality of transmission switchers are configured to switch from the transmission state to the non-transmission state when the portions for detection of the substrates are detected by the corresponding respective detectors.

4. The substrate processing apparatus according to claim 1, further comprising an image sensor that picks up an image of appearance of the substrate after processing by the nozzle.

5. The substrate processing apparatus according to claim 1, wherein the portion for detection is a notch formed at a peripheral edge of the substrate, and the holder holds the substrate by sucking a back surface of the substrate under vacuum at a position radially inward from the notch.

6. The substrate processing apparatus according to claim 1, wherein the plurality of detectors are arranged to line up in the vertical direction, and each detector is arranged to be adjacent to the corresponding holder in a third direction that intersects with the first direction on the horizontal plane.

7. The substrate processing apparatus according to claim 2, wherein the transmission member includes a belt provided to extend in the second direction between the corresponding holder and the clutch.

* * * * *